(12) United States Patent
Nguyen et al.

(10) Patent No.: US 7,199,440 B2
(45) Date of Patent: *Apr. 3, 2007

(54) TECHNIQUES FOR JOINING AN OPTO-ELECTRONIC MODULE TO A SEMICONDUCTOR PACKAGE

(75) Inventors: Luu Thanh Nguyen, Sunnyvale, CA (US); Ken Pham, San Jose, CA (US); Peter Deane, Los Altos, CA (US); William Paul Mazotti, San Martin, CA (US); Bruce Carlton Roberts, San Jose, CA (US); Jia Liu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/026,749

(22) Filed: Dec. 30, 2004

(65) Prior Publication Data

US 2005/0117835 A1 Jun. 2, 2005

Related U.S. Application Data

(60) Continuation of application No. 10/412,564, filed on Apr. 11, 2003, now Pat. No. 6,858,468, which is a division of application No. 09/947,210, filed on Sep. 4, 2001, now Pat. No. 6,642,613, which is a continuation-in-part of application No. 09/568,558, filed on May 9, 2000, now Pat. No. 6,707,140, and a continuation-in-part of application No. 09/713,367, filed on Nov. 14, 2000, now Pat. No. 6,497,518.

(60) Provisional application No. 60/331,377, filed on Aug. 3, 2001.

(51) Int. Cl.
*H01L 29/84* (2006.01)
*H01L 31/0232* (2006.01)
*H01L 23/02* (2006.01)
*H01L 29/40* (2006.01)

(52) U.S. Cl. .................... 257/433; 257/414; 257/432; 257/686; 257/777

(58) Field of Classification Search ............... 257/686, 257/777, 772, 778, 780
See application file for complete search history.

(56) References Cited

U.S. PATENT DOCUMENTS 4,112,479 A 9/1978 White (Continued)

FOREIGN PATENT DOCUMENTS

JP 60-202956 10/1985
JP 08-125066 5/1996

OTHER PUBLICATIONS

U.S. Office Action mailed Dec. 28, 2005 from U.S. Appl. No. 11/015,247.

(Continued)

*Primary Examiner*—Carl Whitehead, Jr.
*Assistant Examiner*—James M. Mitchell
(74) *Attorney, Agent, or Firm*—Beyer Weaver LLP

(57) ABSTRACT

The present invention provides a low cost device that has a true die to external fiber optic connection. Specifically, the present invention relates to an optical device package joined to a semiconductor device package. In some cases, the combination is joined using wirebond studs and an adhesive material. In other cases, the combination is joined using an anisotropic conductive film. Yet, in other cases, the combination is joined using solder material. Each of these joining mechanisms provides high levels of thermal, electrical and optical performance. The joining mechanisms can apply to optical sub-assembly and chip sub-assembly interfaces in transceivers, transmitters, as well as receivers for opto-electronic packages.

20 Claims, 9 Drawing Sheets

U.S. PATENT DOCUMENTS

| | | | |
|---|---|---|---|
| 4,897,711 A * | 1/1990 | Blonder et al. | 257/48 |
| 5,011,246 A | 4/1991 | Corradetti et al. | |
| 5,019,673 A | 5/1991 | Juskey et al. | |
| 5,060,027 A | 10/1991 | Hart et al. | |
| 5,139,969 A | 8/1992 | Mori | |
| 5,172,303 A * | 12/1992 | Bernardoni et al. | 361/744 |
| 5,352,926 A | 10/1994 | Andrews | |
| 5,416,872 A | 5/1995 | Sizer, II et al. | |
| 5,487,124 A | 1/1996 | Bowen et al. | |
| 5,579,208 A | 11/1996 | Honda et al. | |
| 5,608,262 A | 3/1997 | Degani et al. | |
| 5,614,766 A * | 3/1997 | Takasu et al. | 257/777 |
| 5,621,225 A | 4/1997 | Shieh et al. | |
| 5,723,369 A | 3/1998 | Barber | |
| 5,726,079 A | 3/1998 | Johnson | |
| 5,744,827 A | 4/1998 | Jeong et al. | |
| 5,790,384 A | 8/1998 | Ahmad et al. | |
| 5,798,567 A | 8/1998 | Kelly et al. | |
| 5,821,615 A | 10/1998 | Lee | |
| 5,949,135 A * | 9/1999 | Washida et al. | 257/685 |
| 6,043,430 A | 3/2000 | Chun | |
| 6,054,759 A * | 4/2000 | Nakamura | 257/691 |
| 6,075,284 A | 6/2000 | Choi et al. | |
| 6,201,704 B1 | 3/2001 | Poplawski et al. | |
| 6,221,752 B1 | 4/2001 | Chou et al. | |
| 6,236,109 B1 | 5/2001 | Hsuan et al. | |
| 6,239,983 B1 | 5/2001 | Shingai et al. | |
| 6,258,630 B1 | 7/2001 | Kawahara | |
| 6,281,568 B1 | 8/2001 | Glenn et al. | |
| 6,305,848 B1 | 10/2001 | Gregory | |
| 6,316,837 B1 | 11/2001 | Song | |
| 6,316,838 B1 | 11/2001 | Ozawa et al. | |
| 6,318,909 B1 | 11/2001 | Giboney et al. | |
| 6,323,552 B1 | 11/2001 | Koyama | |
| 6,333,522 B1 * | 12/2001 | Inoue et al. | 257/99 |
| 6,340,846 B1 * | 1/2002 | LoBianco et al. | 257/783 |
| 6,376,769 B1 * | 4/2002 | Chung | 174/524 |
| 6,380,563 B2 * | 4/2002 | Farnworth et al. | 257/99 |
| 6,477,286 B1 | 11/2002 | Ouchi | |
| 6,489,676 B2 * | 12/2002 | Taniguchi et al. | 257/698 |
| 6,531,341 B1 | 3/2003 | Peterson et al. | |
| 6,544,812 B1 | 4/2003 | Camenforte et al. | |
| 6,555,764 B1 | 4/2003 | Maruyama et al. | |
| 6,617,195 B1 | 9/2003 | Master et al. | |
| 6,624,507 B1 * | 9/2003 | Nguyen et al. | 257/686 |
| 6,707,140 B1 * | 3/2004 | Nguyen et al. | 257/686 |
| 6,710,454 B1 * | 3/2004 | Boon | 257/777 |
| 6,756,680 B2 * | 6/2004 | Jimarez et al. | 257/772 |
| 6,762,119 B2 | 7/2004 | Ray et al. | |
| 6,769,119 B1 | 7/2004 | England et al. | |
| 6,854,901 B1 * | 2/2005 | Ouchi | 385/89 |
| 6,926,796 B1 | 8/2005 | Nishida et al. | |
| 2001/0013645 A1 | 8/2001 | King et al. | |
| 2001/0019173 A1 | 9/2001 | Taguchi et al. | |
| 2001/0048151 A1 | 12/2001 | Chun | |
| 2002/0047216 A1 | 4/2002 | Jiang et al. | |
| 2002/0089067 A1 | 7/2002 | Crane et al. | |
| 2002/0100974 A1 | 8/2002 | Uchiyama | |
| 2003/0001252 A1 | 1/2003 | Ku et al. | |

OTHER PUBLICATIONS

U.S. Office Action mailed Jun. 14, 2006 from U.S. Appl. No. 11/015,247.

S. Savastiouk, PH.D., et al. "3-D stacked wafer-level packaging", Mar. 2000, *Advanced Packaging*, pp. 28-34.

National Semiconductor, "Packaging Databook", 1993 National Semiconductor, pp. v-xi to 1-3 to 1-4, 3-1 to 3-20, 3-30 to 3-31, 3-62 to 3-69. *Please note: The year of publication is sufficiently earlier than the effective U.S. filing date so that the particular month of publication is not in issue.*

* cited by examiner

TECHNIQUES FOR JOINING AN OPTO-ELECTRONIC MODULE TO A SEMICONDUCTOR PACKAGE

CROSS-REFERENCE TO RELATED APPLICATIONS

This application is a continuation of U.S. patent application Ser. No. 10/412,564, filed Apr. 11, 2003, now U.S. Pat. No. 6,858,468 which is a divisional of U.S. patent application Ser. No. 09/947,210, filed Sep. 4, 2001, now U.S. Pat. No. 6,642,613, which is a continuation-in-part of U.S. patent application Ser. No. 09/568,558, filed May 9, 2000, now U.S. Pat. No. 6,707,140, and a continuation-in-part of U.S. patent application Ser. No. 09/713,367, filed Nov. 14, 2000, now U.S. Pat. No. 6,497,518; U.S. patent application Ser. No. 09/947,210 claims the benefit of U.S. Provisional Application No. 60/331,377, filed Aug. 3, 2001.

This application is related to U.S. patent application Ser. No. 09/922,358, filed Aug. 3, 2001, now U.S. Pat. No. 6,624,507, and to U.S. patent application Ser. No. 10/652,805, filed Aug. 29, 2003.

U.S. patent application Ser. No. 10/412,564, U.S. patent application Ser. No. 09/947,210, U.S. patent application Ser. No. 09/922,358, U.S. patent application Ser. No. 09/568,558, U.S. patent application Ser. No. 09/713,367, and U.S. patent application Ser. No. 10/652,805 are hereby incorporated by reference.

FIELD OF THE INVENTION

The present invention relates to semiconductor packages, and more particularly, to a semiconductor package assembly that provides a true die to external fiber optic cable connection.

BACKGROUND OF THE INVENTION

Most computer and communication networks today rely on copper wiring to transmit data between nodes in the network. Since the data transmitted over the copper wire and the data processed within the nodes are both represented in the form of electrical signals, the transfer of data at the node-copper wire interface is straight forward. Other than perhaps a level shift and signal amplification, no other signal processing is required for data transmitted over the copper wire to be decoded by the node. The drawback with using copper wire is its relatively low bandwidth. Copper's ability to transmit data is significantly limited compared to other mediums, such as fiber optics. Accordingly much of the computer and communication networks being built today, including the Internet, are using fiber optic cabling instead of copper wire.

With fiber optic cabling, data is transmitted using light signals, not electrical signals. For example, a logical one may be represented by a light pulse of a specific duration and a logical zero may be represented by the absence of a light pulse for the same duration. In addition, it is also possible to transmit at the same time multiple colors of light over a single strand of optic fiber, with each color of light representing a distinct data stream. Since light is attenuated less in fiber than electrons traveling through copper, and multiple data streams can be transmitted at one time, the bandwidth of optic fiber is significantly greater than copper.

While fiber optic cabling is very efficient for transferring data, the use of light signals to process data is still very difficult. Data is typically transferred and stored in various locations before, during and after it is operated on in a computer. There still is no efficient way to "store" light signals representative of data. Networks will therefore likely continue using fiber optics for transmitting data between nodes and silicon chips to process the data within the nodes for the foreseeable future. The interface between the fiber optic cable and the nodes that process the data is therefore problematic because signals need to be converted between the electrical and the light domains.

Fiber optic transceivers, which convert light signals from a fiber optic cable into electrical signals, and vice versa, are used as the interface between a fiber optic line and a computer node. A typical transceiver includes a substrate, grooves etched in the substrate to receive the individual fiber optic strands, one or more semiconductor devices mounted on the substrate, one or more discrete optical detectors for converting light signals received over the fiber optic cables into electrical signals, one or more discrete optical emitters for converting electrical signals from the semiconductor devices into light signals. A number of fiber optic transceivers are commercially available from Hewlett Packard, AMP, Sumitomo, Nortel and Siemens. The problem with all of these fiber optic transceivers is that they are expensive and difficult to fabricate. With each transceiver, the semiconductor devices, emitters, and optical detectors have to be individually mounted onto the substrate, which is a costly and time consuming process. This limits the applications in which optical interconnects could be substituted for traditional copper usage. Furthermore the use of discrete emitters and optical detectors adversely affects the performance of the transceiver because electrical parasitics between discrete components are sources of electrical attenuation of inter-chip signals at Gigabit per second speeds that are generally used with such transceivers, more power is consumed for driving these traces than would not be needed for an integrated device. The form factor of the on-board optical transceiver is relatively large and therefore does not facilitate inter-board and chip-to-chip optical interconnectability.

A low cost semiconductor device that provides a true die to external fiber optic connection is therefore needed.

BRIEF SUMMARY OF THE INVENTION

The present invention provides a low cost device that has a true die to external fiber optic connection. Specifically, the present invention relates to an optical device package joined to a semiconductor device package. In some cases, the combination is joined using wirebond studs and an adhesive material. In other cases, the combination is joined using an anisotropic conductive film. Yet, in other cases, the combination is joined using solder material. Each of these joining mechanisms provides high levels of thermal, electrical and optical performance. The joining mechanisms can apply to optical sub-assembly and chip sub-assembly interfaces in transceivers, transmitters, as well as receivers for opto-electronic packages.

In one aspect of the present invention, a device includes an optical device package attached to a semiconductor device package. The device includes a plurality of solder ball formations applied onto electrical contact surfaces located on a top surface of the semiconductor device package. A bottom surface of the optical device package is placed onto the top surface of the semiconductor device package such that electrical contact surfaces on the bottom surface of the optical device package make contact with the solder ball formations.

In another aspect of the present invention, the semiconductor device package can take the form of a molded plastic package that contains an embedded semiconductor die wherein the top surface of the die contains up-linking contacts that are exposed through the top surface of the device package. The semiconductor device package can take various forms such as, but not limited to, a leadless leadframe package, a ball grid array package, a small outline package, a quad flat package, or a dual inline package.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention relates to several techniques for joining an optical device package to a semiconductor device package. The first technique involves using wirebond studs and an adhesive material, the second technique involves the use of an anisotropic conductive film, and the third technique involves the use of solder material. Each of these techniques provides high levels of thermal, electrical and optical performance. Although these techniques are preferably used to join optical and semiconductor packages, these same techniques can be used to join other combinations of packages. For instance, these techniques can also be used to join two semiconductor packages.

The techniques of the present invention are preferably implemented together with optical device packages that have electrical contacts on a bottom surface and semiconductor device packages that have electrical contacts on a top surface. The optical and semiconductor device packages are then joined together by connecting their respective electrical contacts. When combining optical and semiconductor devices into a single device, the optical device packages and semiconductor device packages are commonly referred to as optical subassemblies (OSA) and chip subassemblies (CSA), respectively. As such, the terms OSA and CSA will be used throughout this specification. Each of these techniques will now be described.

Figure 1:
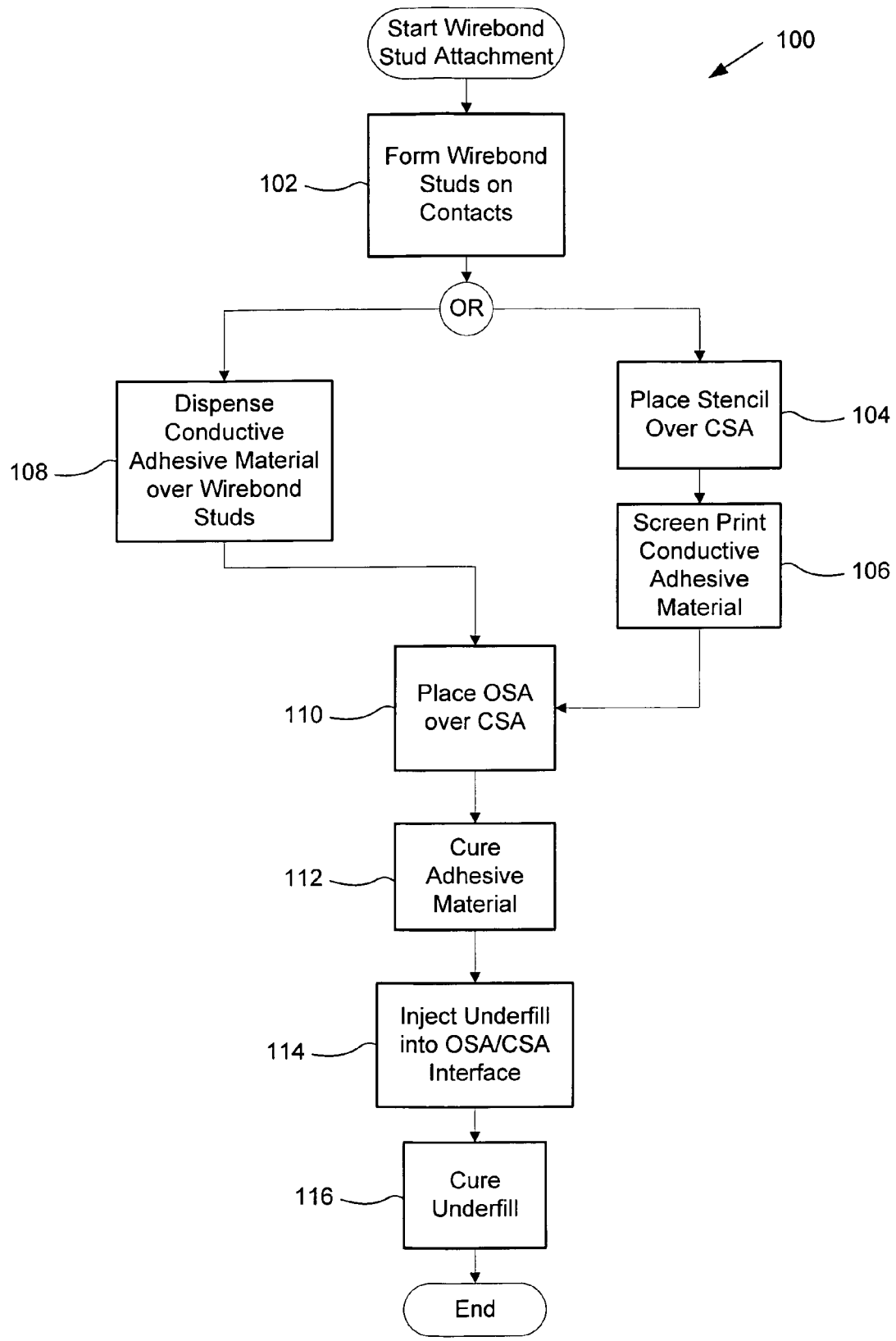
FIG. 1 illustrates a flow diagram representing the operations for joining an optical device package to a semiconductor device package according to one implementation of the present invention.

FIG. 1 illustrates a flow diagram 100 representing the operations for joining an optical device package to a semiconductor device package according to one implementation of the present invention. To facilitate the description of the wirebond stud technique, FIGS. 2A–2E will be referenced throughout the description of FIG. 1. FIGS. 2A–2E illustrate side plan views of a CSA 200 being joined to an OSA 202 according to the operations of FIG. 1.

Figure 2A:
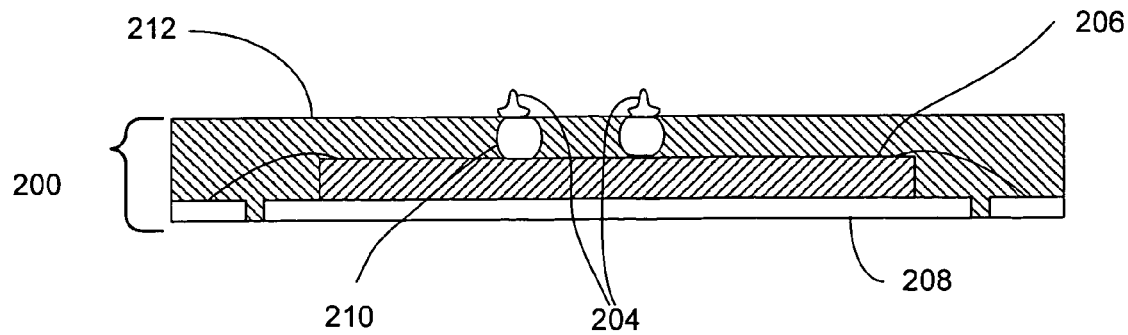
FIG. 2A illustrates a side plan view of a portion of a chip subassembly having wirebond studs formed on its top surface.

The process of attaching an OSA to a CSA using wirebond studs starts at block 102 where wirebond studs are formed on the electrical contacts located on the top surface of a CSA. FIG. 2A illustrates a side plan view of a portion of a CSA 200 having wirebond studs 204 formed on its top surface. CSA 200 includes a semiconductor die 206 that is attached to a die attach pad 208, solder balls 210 that form the electrical contacts for the CSA 200, and a plastic molding material 212. The plastic molding material encapsulates these components except for leaving an exposed area of the solder ball 210 so that an external electrical connection can be made. The wirebond studs 204 are formed on the exposed area of the solder balls 210. The method for forming wirebond studs, as is commonly known, is performed by using wirebonding techniques of forming a ball bond, extruding a short length of wire, then cutting the wire. Typically, the wire is gold and the wires can have diameters in the range of 0.6 to 1.2 mils. Other materials and diameters are feasible depending upon the specific design requirements, for example, the dimensions of the exposed area of the solder balls 210. Typically, the diameter of the ball bonded portion of the wirebond stud is 2–2.5 times larger than the diameter of the wire portion.

It is important that a leveling step be included right after gold wirebond stud formation. This step involves flattening the wirebond studs to a desired height by pushing these studs against a smooth, level, and hard surface. By careful force and position control, a controlled amount of leveling can be achieved to provide a desired standoff (height) to the wirebond studs. This step ensures that the gap between the OSA and CSA stays within a repeatable and well-controlled distance for best alignment and mechanical coupling.

It is preferable to form the wirebond studs on the CSA's rather than the OSA's because the CSA's are typically aligned in a matrix of columns and rows during manufacturing processes. Therefore, it is more efficient to form the wirebond studs using automated processes while the CSA's are in the matrix during these manufacturing processes. However, in alternative embodiments of the invention, it is possible to form the wirebond studs on the OSA rather than the CSA.

Figure 2B:
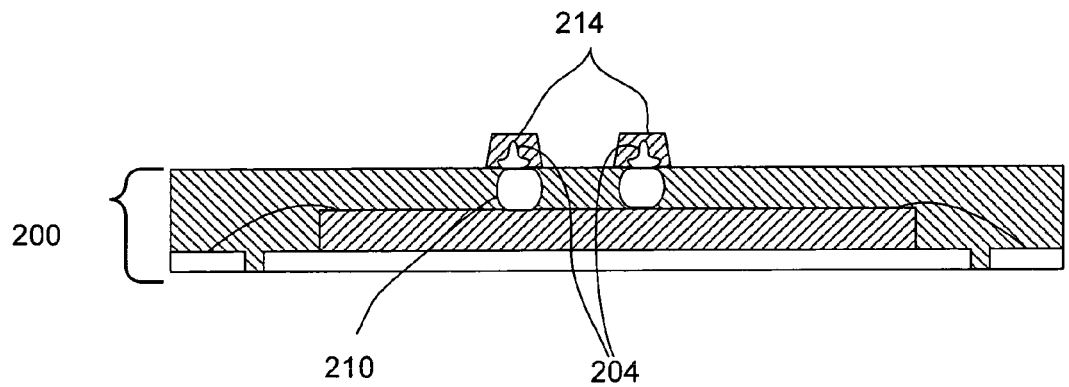
FIG. 2B illustrates a side plan view of CSA having screen-printed adhesive material covering the wirebond studs.

After the wirebond studs 204 are formed, an adhesive material is applied over top of the wirebond studs 204. Adhesive material can be applied to the wirebond studs 204 in alternative methods. One method is represented in block 104 and 106 where a stencil is placed over top of the CSA and then the adhesive material is screen printed onto the CSA through the stencil. FIG. 2B illustrates a side plan view of CSA 200 having screen-printed adhesive material 214 covering the wirebond studs 204.

Figure 2C:
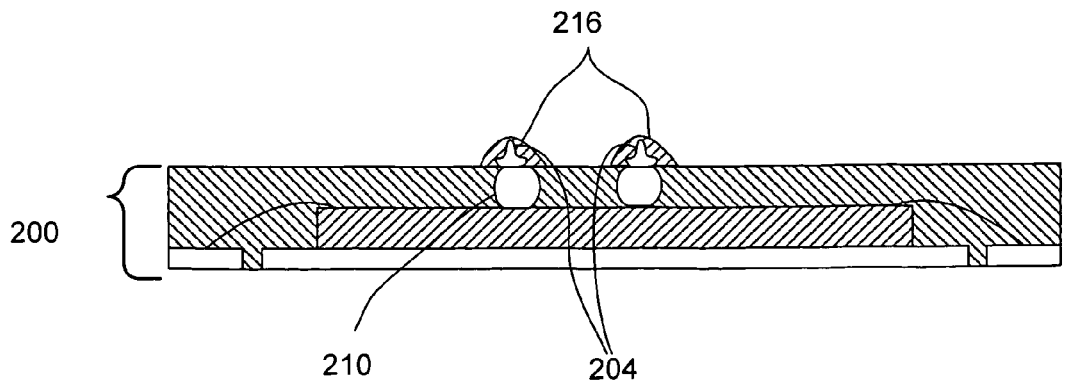
FIG. 2C illustrates a side plan view of CSA having dispensed adhesive material covering the wirebond studs.

An alternative method is represented in block 108 where an adhesive material is dispensed over the wirebond studs 204. A pressurized volumetric dispenser can be used to dispense the desired amounts of adhesive over the wirebond studs 204. FIG. 2C illustrates a side plan view of CSA 200 having dispensed adhesive material 216 covering the wirebond studs 204.

The adhesive material can be epoxy, conductive solder, or an appropriate glue material. In the case that the wirebond studs 204 were formed on an OSA rather than the CSA, then it follows that the adhesive material would be placed on the OSA to cover the wirebond studs.

Figure 2D:
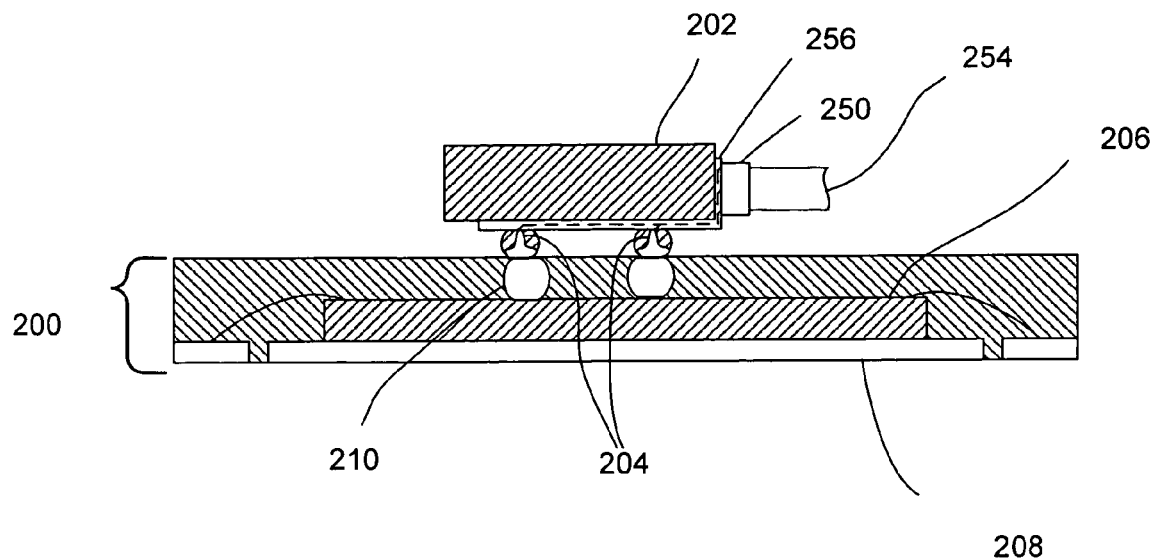
FIG. 2D illustrates a side plan view of an OSA placed on top of CSA such that the electrical contact surfaces of the OSA are aligned with the wirebond studs.

In block 110, the OSA is placed on top of the CSA such that the electrical contacts on the bottom surface of the OSA are aligned with the wirebond studs formed on the CSA. The operation of block 110 is illustrated in FIG. 2D. FIG. 2D illustrates a side plan view of an OSA placed on top of CSA 200 such that the electrical contact surfaces of the OSA are aligned with the wirebond studs 204. The OSA in FIG. 2D shows that the OSA has a body 202, an emitter 250 and an optical detector (not shown), and optical fibers 254. The body 202 can be formed of plastic, ceramic or any other material that is light in weight and suitable for supporting emitters and receivers. The transmiter 250 and the detector are commonly known devices used to send and receive light signals that pass through the fibers 254. The emitter 250 and the detector are each electrically connected to a flexible circuitry tape 256, which is a flexible tape with embedded circuitry traces. The flexible circuitry tape 256 wraps around the side and the bottom surface of the OSA body 202 so that the emitter 250 and the detector 252 can be connected to the die 206. The circuit traces on the tape 256 are connected to the solder balls 210 through the wirebond studs 204.

The operation of placing the OSA on top of the CSA can be an automated process such that multiple numbers of OSA are placed on respective CSA that are aligned in a matrix array. The height of the wirebond studs can be varied to provide a desired standoff distance between the CSA and the OSA.

In block 112 the OSA and CSA combination is put through a curing process to cure the adhesive material. For improved accuracy of placing the OSA onto the CSA, snap curing is preferable. Without snap curing, there is the possibility that the OSA structure may move during curing due to the lowering of the glue viscosity prior to the onset of cure. Such motion will defeat the pick and place accuracy obtained prior to cure and required for best mechanical coupling and alignment.

Figure 2E:
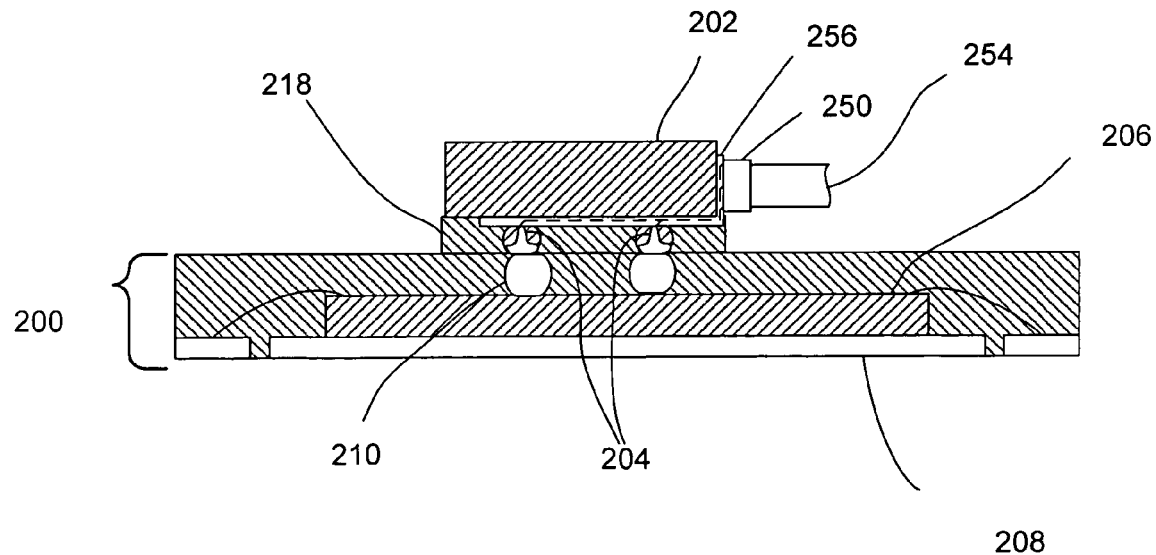
FIG. 2E illustrates a side plan view of an OSA joined to a CSA where underfill material fills the gaps between the wirebond studs that connect the two subassemblies.

In block 114, underfill material is injected into the interface between the OSA and the CSA. The underfill material serves to increase the strength of the bond between the two components and can increase heat dissipation performance. The underfill material is preferably a low-stress epoxy, for example, Dexter FP4549 or Namics 8437-2. FIG. 2E illustrates a side plan view of an OSA 202 joined to a CSA 200 where underfill material 218 fills the gaps between the wirebond studs 204 that connect the two subassemblies. Injection of the underfill material 218 is an optional operation, without which, a sufficiently strong connection between the OSA 202 and the CSA 200 can still be formed.

In block 116, the OSA and CSA combination is put through a curing process to cure the underfill material 218. At this point, the wiredbond stud technique for joining the OSA to the CSA is completed.

Figure 3:
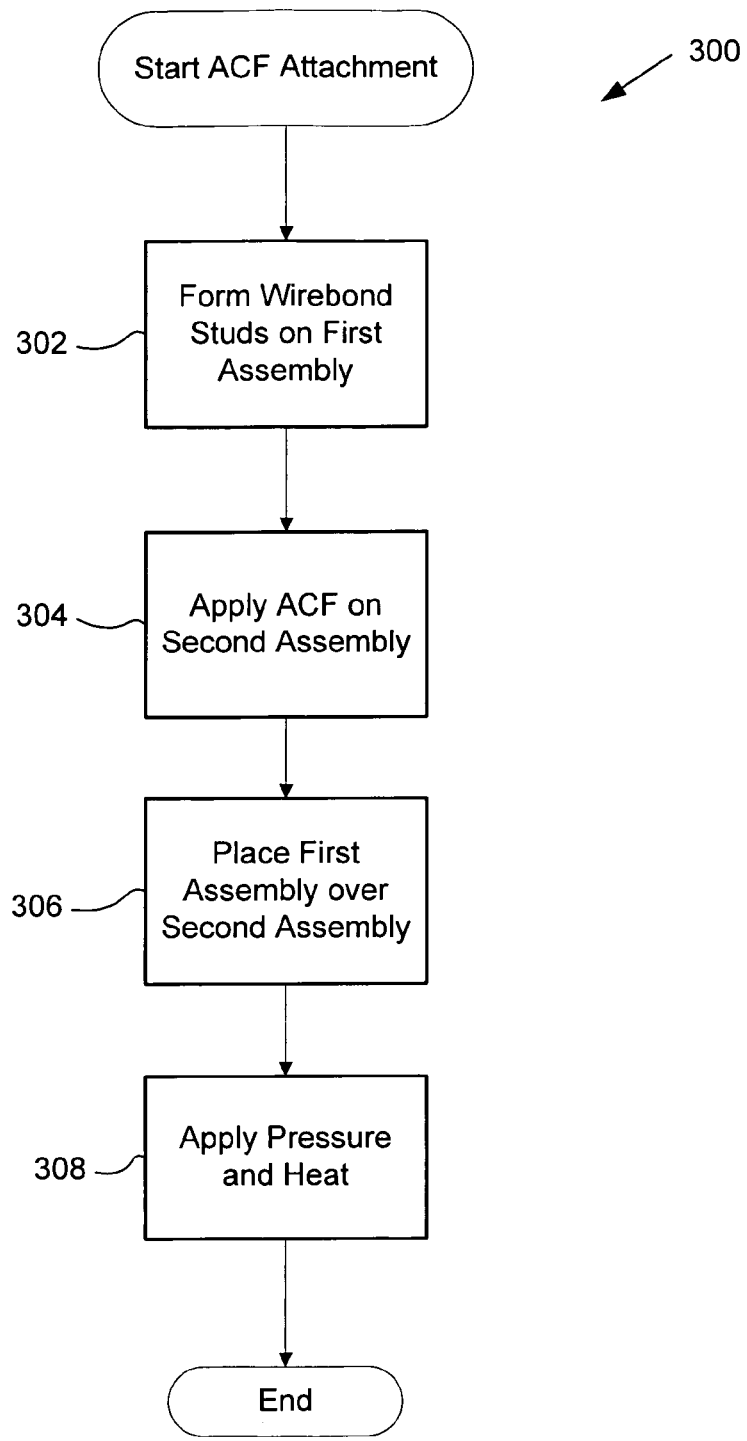
FIG. 3 illustrates a flow diagram representing the operations for joining an optical subassembly to a chip subassembly by using an anisotropic conductive film according to one implementation of the present invention.
Figure 4A:
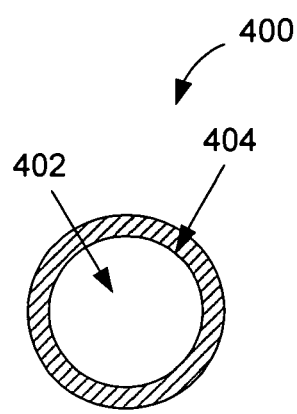
FIG. 4A illustrates a hard particle for use in an anisotropic conductive film that has a hard nickel core and a gold outer layer.
Figure 4B:
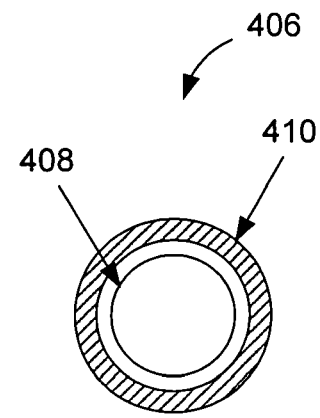
FIG. 4B illustrates a relatively soft particle for use in an anisotropic conductive film that is made of a soft polymer core and a gold outer layer.

FIG. 3 illustrates a flow diagram 300 representing the operations for joining an OSA to a CSA by using an anisotropic conductive film according to one implementation of the present invention. FIGS. 4A–7B will be referenced and described during the explanation of FIG. 3 to facilitate the description of FIG. 3. Anisotropic conductive film (ACF) is a polymer-based film loosely filled with conductive particles. The film becomes conductive only when pressure is applied to force contact between these particles. These particles can vary in hardness and are selected to fill a film based upon the construction of the interconnection interface between the OSA and the CSA. FIGS. 4A and 4B illustrate two types of particles. FIG. 4A illustrates a hard particle 400 for use in an anisotropic conductive film that has a hard nickel solid core 402 and a gold outer layer 404. The hard particle 400 is intended to break through the oxide layer that typically forms on the surface of aluminum contact pads so that a good electrical contact can be formed. FIG. 4B illustrates a relatively soft particle 406 for use in an anisotropic conductive film that is made of a soft polymer shell 408 and a gold outer layer 410. The relatively softer particle 406 is designed so that the polymer core collapses upon application of force, which allows for a smaller standoff gap between an OSA and a CSA. The ACF can contain only one type of conductive particle or it can contain a mixture of the two mentioned types of particles depending upon design parameters.

Figure 5A:
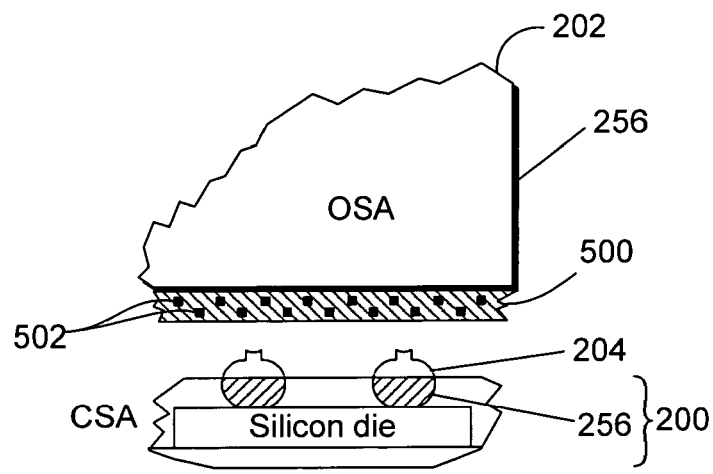
FIG. 5A illustrates a side plan view of an OSA having an applied ACF and a CSA having wirebond studs.
Figure 6A:
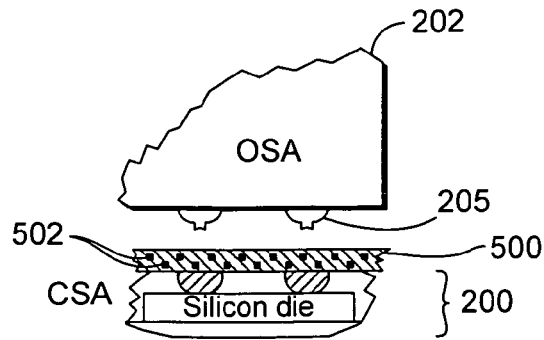
FIG. 6A illustrates a side plan view of an OSA having wirebond studs and a CSA having an applied ACF.

The technique of flow diagram 300 starts with block 302 where wirebond studs are formed on either the CSA or the OSA. In block 304, an ACF is placed on an OSA if the wirebond studs were formed on a CSA, and an ACF is placed on a CSA if the wirebond studs were formed on an OSA. The process decision of placing the wirebond studs on the CSA or the OSA and the ACF on the respective OSA or CSA for attachment depends upon factors such as the assembly equipment parameters. For example, the pick and place mechanisms, the film handling mechanisms, the thermode configuration, etc., all can effect the decision. The chronological order of applying ACF and the application of wire ball studs is not important. These operations can be performed simultaneously. FIG. 5A illustrates a side plan view of an OSA 202 having an applied ACF 500 and a CSA 200 having wirebond studs 204. On the other hand, FIG. 6A illustrates a side plan view of an OSA 202 having wirebond studs 204 and a CSA 200 having an applied ACF 500.

In block 306, the OSA and the CSA are placed together such that the wirebond studs 204 sink into the ACF 500.

Figure 5B:
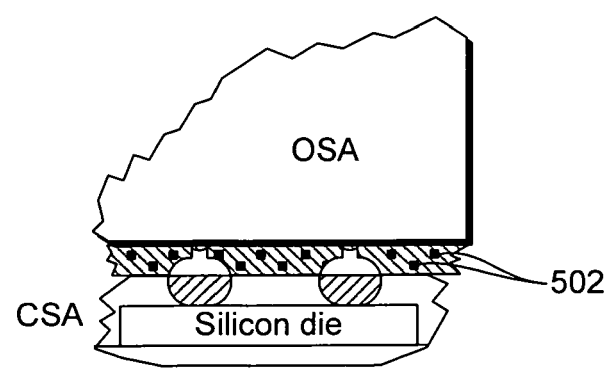
FIG. 5B illustrates a side plan view of the OSA and the CSA of FIG. 5A after they have been placed together.
Figure 6B:
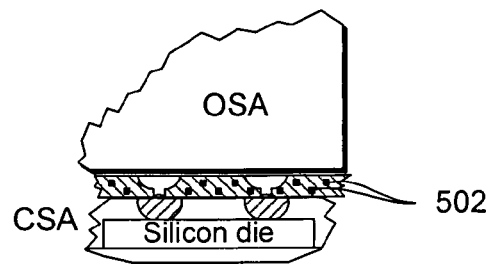
FIG. 6B illustrates a side plan view of the OSA and the CSA of FIG. 6A after they have been placed together.

In block 308, pressure and heat are applied to the OSA and CSA combination so that the wirebond studs 204 make contact with and apply pressure to the loose particles 502 within the ACF 500 so that the particles 502 make contact with each other. As a result, the particles 502 and the wirebond studs 204 provide an electrically conductive path between the electrical contact surfaces of the OSA 202 and the CSA 200. FIG. 5B illustrates a side plan view of the OSA 202 and the CSA 200 of FIG. 5A after they have been placed together. Similarly, FIG. 6B illustrates a side plan view of the OSA 202 and the CSA 200 of FIG. 6A after they have been placed together. It is noted that since no gaps exist between the joined OSA and CSA, underfill is not required. The ACF can provide equivalent bonding support and heat dissipation qualities that underfill material provides. It is also noted that adhesive material does not need to be specifically applied to the wirebond studs since the ACF provides the adhering properties. After block 308 a separate curing process can be performed to cure the ACF material 500. At this point the combination of the OSA and the CSA is completed. Due to the arrangement in which CSA's are aligned in a matrix array during manufacturing processes, it is preferable to apply the ACF to CSA rather than the OSA.

Figure 7A:
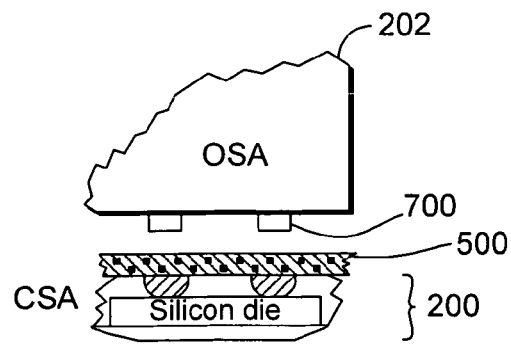
FIG. 7A illustrates a side plan view of an OSA having contact pads that will be placed onto CSA having a layer of ACF.
Figure 7B:
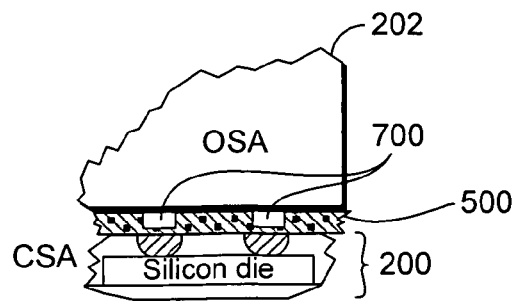
FIG. 7B illustrates a side plan view of the OSA and the CSA in FIG. 7A after they have been joined to each other.

FIGS. 7A and 7B illustrate an alternative technique for use with ACF. FIG. 7A illustrates a side plan view of an OSA 202 having contact pads 700, rather than wirebond studs, that will be placed onto a CSA 200 having a layer of ACF 500. FIG. 7B illustrates a side plan view of the OSA 202 and the CSA 200 in FIG. 7A after they have been joined to each other. Heat and pressure are applied to the OSA and CSA combination to complete the joining technique. In alternative embodiments, the plates 700 can be attached to the CSA 200 and the ACF attached to the OSA 202.

Figure 8:
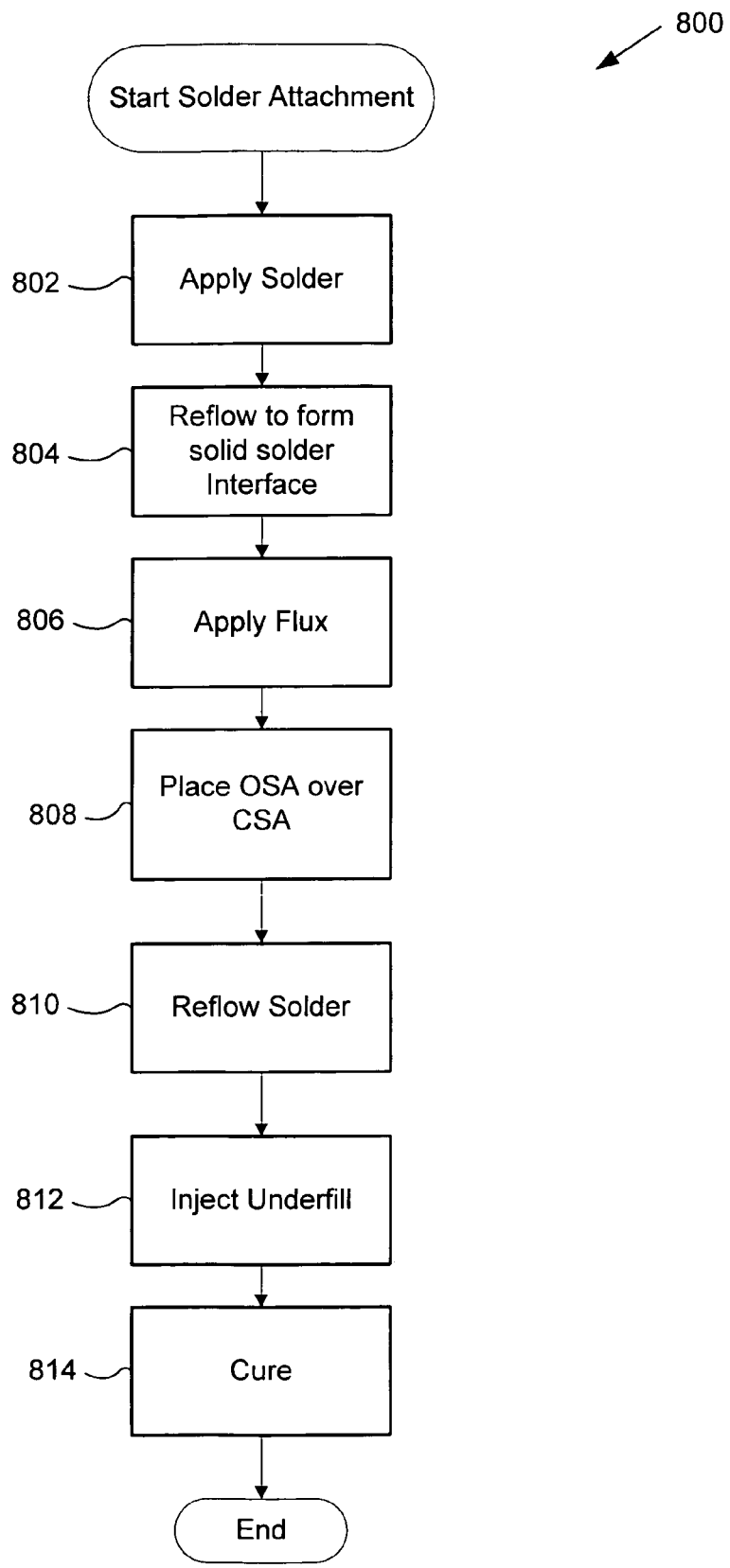
FIG. 8 illustrates a flow diagram that represents the technique for attaching an OSA to a CSA by using solder material according to one embodiment of the present invention.
Figure 9A:
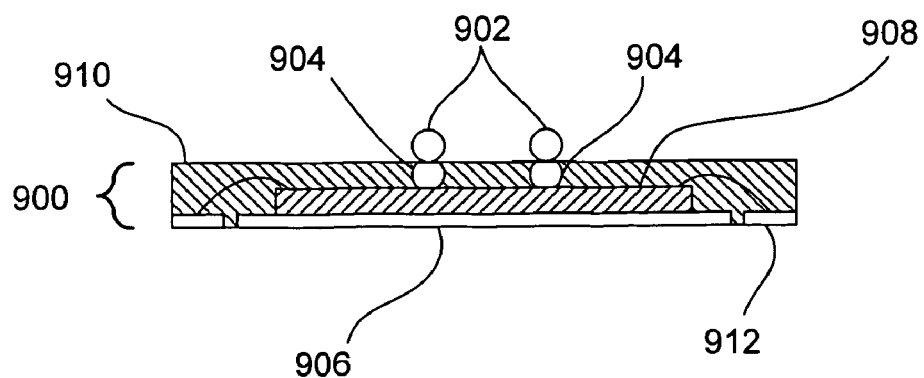
FIG. 9A illustrates a side plan cross-sectional view of a CSA having solder balls formed on the electrical conduits of the CSA.
Figure 9B:
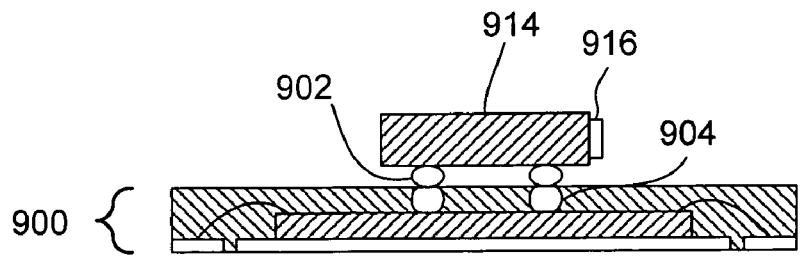
FIG. 9B illustrates a side plan cross-sectional view of an OSA placed on top of the solder balls of the CSA.
Figure 9C:
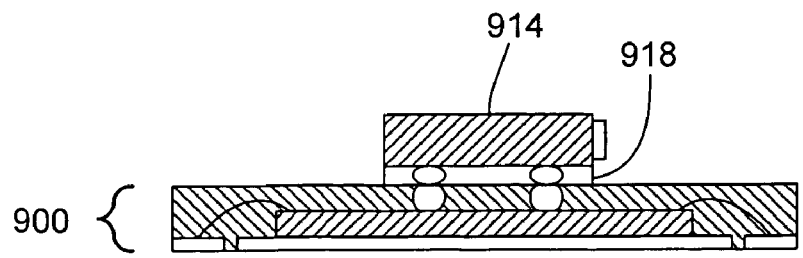
FIG. 9C illustrates a side plan view of the OSA and the CSA of FIG. 9B after underfill material has been injected into the interface between the two subassemblies.

FIG. 8 illustrates a flow diagram 800 that represents the technique for attaching an OSA to a CSA by using solder material according to one embodiment of the present invention. FIGS. 9A–9C will be referenced and described throughout the description of FIG. 8 to facilitate the description of the solder attachment technique.

The solder technique of flow diagram 800 starts with block 802 where solder ball formations are applied to the electrical contact surfaces on the top of the CSA. Solder material can be applied to the CSA in various manners. First, solder wire material can be attached to the CSA through wire bonding technique where a solder wirebond stud is formed. The solder wirebond stud is then reflowed to form a solder ball formation. Secondly, solder paste can be screen printed directly onto the surface of the electrical contact surfaces of the CSA. The thickness of the solder material depends upon the thickness of the stencil and the size of the apertures within the stencil. Typically, stencils vary in thickness from 3 mils (minimum) and upward to 15 mils.

Another method is to dispense solder balls onto the electrical contact surfaces using a pressure-driven volumetric dispenser. Solder balls can also be placed on the CSA through the openings of a mesh placed on top of the CSA. Yet another method of applying solder balls onto the electrical contacts of a CSA is to place pre-formed solder balls onto the CSA. The size of the solder balls affects the standoff height between the CSA and the OSA. The solder balls have an initial height before the attachment of the OSA to the CSA and then they collapse to a shorter height after attachment.

FIG. 9A illustrates a side plan cross-sectional view of a CSA 900 having solder balls 902 formed on the electrical conduits 904 of the CSA 900. The CSA 900 is a leadless leadframe package, which includes a die attach pad 906, which supports a semiconductor die 908. On top of the die 908 are the electrical conduits 904, which can also be formed of solder material. Electrical contacts 912 are wirebonded to the die 908 and allow for the connection of the CSA 900 to an external device. The die attach pad 906, the die 908, the electrical contacts 912, and the electrical conduits 904 are packaged within a plastic molding material 910.

In block 804, the solder material applied to the CSA in block 902 is reflowed to form the solder ball interface. In block 806, flux is applied to the solder balls. As is commonly known, flux is applied to the surface of the solder balls to facilitate the flowing of the solder material and to prevent the formation of oxides.

In block 808, an OSA 914 is placed on top of the solder balls 902 such that pads and electrical traces on the OSA that connect to the laser emitter 916 and the optical detector (not shown) of the OSA are connected to the electrical conduits 904 of the CSA 900 through solder balls 902. FIG. 9B illustrates a side plan cross-sectional view of an OSA 914 placed on top of the solder balls 902 of the CSA 900. The solder balls 902 make contact with pads and electrical traces connected to the laser emitter 916 and the optical detector of the OSA 914.

In block 810, the OSA and CSA combination undergoes a reflowing process to join the solder balls to the contacts on the OSA and the CSA, respectively. In block 812, underfill material is injected into the interface between the OSA 914 and the CSA 900. The underfill 900, as described before, increases the strength of the bond between the OSA and the CSA and facilitates heat dissipation. In block 814, the joined CSA and OSA undergo a curing process to secure the bond between the two subassemblies.

In one embodiment of the technique of using solder material to join a CSA and an OSA, the solder balls 904 in the CSA 900 are high lead (95Pb/5Sn) solder balls. The solder balls 902 used to connect the OSA and the CSA are (63Pb/37Sn) solder balls and can have diameters of approximately 5–10 mils. Actually, any high lead composition or lead-free compositions, for example, SnAgCu, SnAg, or SnCu, can be used in the CSA 900. The requirement for the solder balls 904 in the CSA 900 is that they need to withstand the typical molding temperatures (170–180 degrees Celsius) without deformation. Solder balls 902 forming the interface between the CSA and the OSA can be eutectic SnPb or any solder composition with melting temperature within a range of 170–190 degrees Celcius. These requirements ensure that subsequent assembly steps do not thermally affect previous operations.

From a manufacturing standpoint, the solder method described in FIG. 8 is preferable over the wirebond stud and the ACF techniques of FIGS. 1 and 3, respectively. One reason is that the OSA centers itself upon the solder balls during reflow due to the surface tension effects of the solder balls. As a result, the process of placing the OSA on top of the CSA does not need to be as accurate as for the wirebond stud and ACF techniques.

Figure 10A:
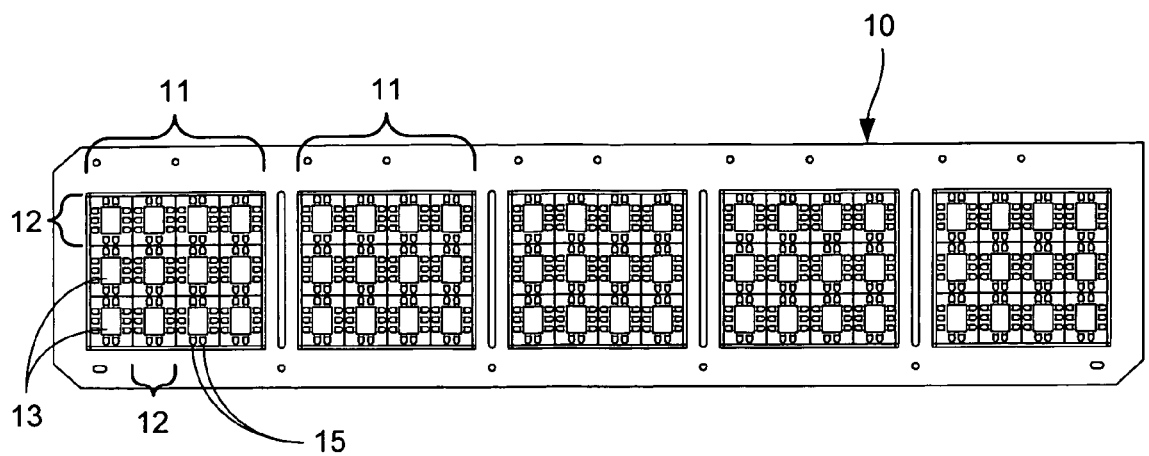
FIG. 10A is a top plan view of a conventional lead frame strip suitable for use in forming leadless leadframe packages.
Figure 10B:
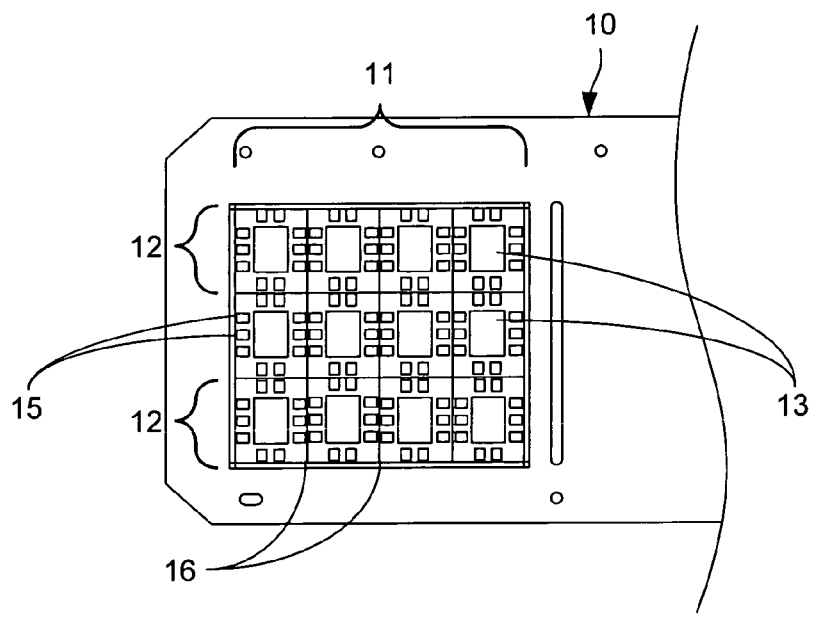
FIG. 10B is an enlarged top plan view of one end of the lead frame strip of FIG. 10A, illustrating one array of device areas.

A specific type of CSA is a leadless leadframe package (LLP). An LLP contemplates the use of a metal (typically copper) substrate in the formation of a chip scale package (CSP). As illustrated in FIGS. 10A and 10B, in typical leadless leadframe packages, a copper leadframe strip or panel 10 is patterned to define a plurality of arrays or matrixes 11 of semiconductor device areas 12. Each device area 12 includes a die attach pad 13 and a plurality of contacts 15 disposed about their associated die attach pad 13. Very fine tie bars 16 are used to support the die attach pads 13 and contacts 15.

Figure 11:
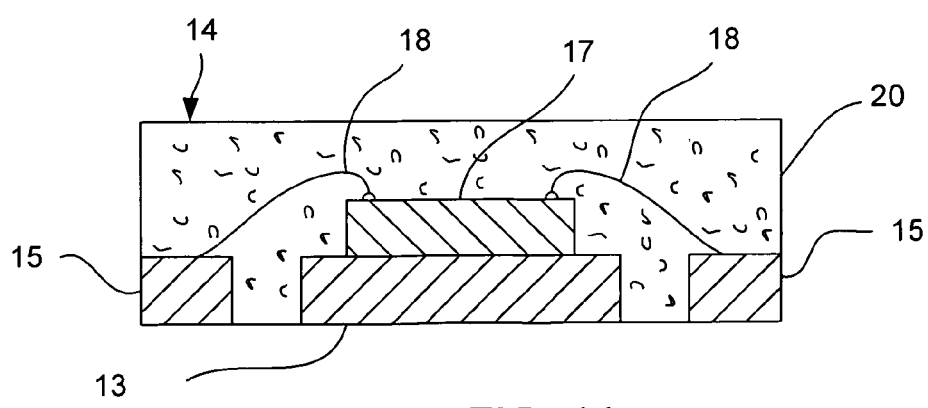
FIG. 11 is a cross-sectional side view of a conventional leadless leadframe package.

FIG. 11 illustrates a cross-sectional view of a typical resulting leadless leadframe package 14. The die attach pad 13 supports a die 17 which is electrically connected to its associated contacts 15 by bonding wires 18. A molded cap 20 encapsulates the die 17 and bonding wires 18, and fills the gaps between the die attach pad 13 and the contacts 15 thereby serving to hold the contacts 15 in place. It should be appreciated that during singulation of the individual packages 14, the tie bars 16 are cut and therefore the only materials holding the contacts 15 in place is the molding material. The resulting packaged chip can then be surface mounted on a printed circuit board or other substrate using conventional techniques.

The techniques of this present invention can be implemented for various CSA form factors that have exposed electrical contact surfaces located on a portion of the CSA's packaging surface. Such form factors may include SOP, QFP, DIP, BGA, etc.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A device, comprising:
    a semiconductor device package having a semiconductor die with a first plurality of solder ball formations on a top surface of the semiconductor die, wherein the semiconductor die and the first plurality of solder ball formations are encapsulated within a protective molding material such that a top surface of each solder ball formation of the first plurality of solder ball formations is exposed and forms electrical contact surfaces on the top surface of the semiconductor device package, and wherein a second plurality of solder ball formations are applied onto the electrical contact surfaces; and
    an optical device package having a bottom surface with electrical contact surfaces, wherein a bottom surface of the optical device package is placed onto the top surface of the semiconductor device package such that electrical contact surfaces on the bottom surface of the optical device package make contact with associated ones of the second plurality of solder ball formations.

2. The device as recited in claim 1 wherein the second plurality of solder ball formations separate and create a standoff gap between the optical device package and the semiconductor device package, the device further comprising:
    an underfill material filling the standoff gap, wherein the underfill material is cured.

3. The device as recited in claim 1 wherein the second plurality of solder ball formations are from reflowing a plurality of solder wirebond studs formed on the electrical contact surfaces on the top surface of the semiconductor device package.

4. The device as recited in claim 1 wherein the second plurality of solder ball formations are from solder material screen printed onto the electrical contact surfaces on the top surface of the semiconductor device package.

5. The device as recited in claim 1 wherein the second plurality of solder ball formations are from individual solder balls dispensed onto each of the electrical contact surfaces on the top surface of the semiconductor device package.

6. The device as recited in claim 1 wherein the electrical contact surface on the optical device package is part of a flexible tape material having embedded circuit traces, the embedded circuit traces having a first end connected to an optical device component and a second end that forms the electrical contact surface of the optical device package.

7. The device as recited in claim 6 wherein the flexible circuit tape is adhered to a side and a bottom surface of the optical device package.

8. The device as recited in claim 1 wherein the semiconductor device package is a leadless leadframe package or a ball grid array package.

9. The device as recited in claim 1 wherein the semiconductor device package is a small outline package, quad flat package, or a dual inline package.

10. The device as recited in claim 1 wherein the optical device package is formed by attaching at least one optical device component to a side surface of a support block wherein the electrical contact surfaces on the bottom surface of the optical device package are located on the bottom surface of the support block.

11. A device, comprising:
    a semiconductor package wherein the semiconductor package is a leadless leadframe package having a top, a bottom, and a plurality of side surfaces, the semiconductor package having contact leads that are flush wit the bottom surface of the semiconductor package and which do not extend beyond each of the side surfaces of the semiconductor package, wherein a plurality of solder ball formations is applied onto electrical contact surfaces located on the top surface of the semiconductor device package; and
    an optical device package having a bottom surface with electrical contact surfaces, wherein a bottom surface of the optical device package is placed onto the top surface of the semiconductor device package such that electrical contact surfaces on the bottom surface of the optical device package make contact with associated ones of the solder ball formations.

12. The device as recited in claim 11 wherein the optical device package is formed by attaching at least one optical device component to a side surface of a support block wherein the electrical contact surfaces on the bottom surface of the optical device package are located on the bottom surface of the support block.

13. The device as recited in claim 12 wherein the electrical contact surfaces on the bottom surface of the support block are part of a flexible tape material having embedded circuit traces, the embedded circuit traces having a first end connected to the optical device component and a second end that forms the electrical contact surfaces on the bottom surface of the support block.

14. The device as recited in claim 13 wherein the flexible circuit tape is adhered to the side and a bottom surface of the support block.

15. The device as recited in claim 1, wherein the semiconductor device package comprises a plurality of side surfaces, a bottom surface, and a plurality of contact leads that are flush with the bottom surface of the semiconductor device package.

16. The device as recited in claim 15, wherein the plurality of contact leads is electrically connected to the semiconductor die.

17. The device as recited in claim 16, wherein the plurality of contact leads does not extend beyond the plurality of side surfaces of the semiconductor package.

18. The device as recited in claim 17, wherein the semiconductor die is positioned on top of a die attach pad.

19. The device as recited in claim 18, wherein the die attach pad comprises a bottom surface that is exposed on the bottom surface of the semiconductor package.

20. The device as recited in claim 19, wherein the bottom surface of the die attach pad is flush with the bottom surface of the semiconductor device package.

* * * * *

UNITED STATES PATENT AND TRADEMARK OFFICE
CERTIFICATE OF CORRECTION

| | |
|---|---|
| PATENT NO. | : 7,199,440 B2 |
| APPLICATION NO. | : 11/026749 |
| DATED | : April 3, 2007 |
| INVENTOR(S) | : Nguyen et al. |

Page 1 of 1

It is certified that error appears in the above-identified patent and that said Letters Patent is hereby corrected as shown below:

Col. 10, line 51 (Claim 11), change "wit" to --with--.

Signed and Sealed this

Twenty-first Day of October, 2008

JON W. DUDAS
*Director of the United States Patent and Trademark Office*